United States Patent [19]

Lavallee et al.

[11] Patent Number: 5,267,242
[45] Date of Patent: Nov. 30, 1993

[54] METHOD AND APPARATUS FOR SUBSTITUTING SPARE MEMORY CHIP FOR MALFUNCTIONING MEMORY CHIP WITH SCRUBBING

[75] Inventors: Russell W. Lavallee; Donald G. O'Brien, both of Poughkeepsie; Michael Rubino, Hopewell Junction; William W. Shen; George C. Wellwood, both of Poughkeepsie, all of N.Y.

[73] Assignee: International Business Machines Corporation, Armonk, N.Y.

[21] Appl. No.: 755,209

[22] Filed: Sep. 5, 1991

[51] Int. Cl.⁵ ............................................. G06F 11/00
[52] U.S. Cl. .................................. 371/10.1; 371/10.2; 371/37.3
[58] Field of Search ...................... 371/10.1, 40.2, 13, 371/10.2, 37.3

[56] References Cited

U.S. PATENT DOCUMENTS

| | | | |
|---|---|---|---|
| 4,231,089 | 10/1980 | Lewine et al. | 371/10.1 |
| 4,296,494 | 10/1981 | Ishikawa et al. | 371/13 |
| 4,371,754 | 2/1983 | De et al. | 371/16.3 |
| 4,458,349 | 7/1984 | Aichelmann et al. | 371/13 |
| 4,532,628 | 7/1985 | Matthews | 371/13 |
| 4,584,682 | 4/1986 | Shah et al. | 371/10 |
| 4,872,166 | 10/1989 | Jippo | 371/11.1 |
| 4,888,773 | 12/1989 | Arlington et al. | 371/40.2 |
| 5,077,737 | 12/1991 | Leger et al. | 371/10.1 |

FOREIGN PATENT DOCUMENTS 57-50193  3/1982  Japan ................................ 371/10.1

OTHER PUBLICATIONS

Research Disclosure, Mar. 1991, #323-"Memory On-Chip Complement/Recomplement" by A. Brearley et al.
Research Disclosure Jul. 1990, #315-"Revised Complement/Recomplement with On-Chip Error Correction" by A. Brearley et al.
IBM TDB-vol. 32, No. 4B, Sep. 1989-"Hardware Mechanism To ... Memory Error", by W. Hardell et al. p. 241.
IBM TDB vol. 32, No. 4B, Sep. 1989-"Capability To Steer a Bit Without ... Soft Error"-by W. Hardell et al.-p. 249.
IBM TDB-vol. 29, No. 7, Dec. 1986-"Dynamic Sparing of Storage Modules" by R. Fuqua et al.-pp. 2828-2829.
IBM TDB-vol. 28, No. 11, Apr. 1986-"Intermittent Array Failure Identification" by J. Datres et al., p. 4796.
IBM TDB-vol. 28, No. 5, Oct. 1985-"Error Handling During Interleaved Memory Operations"-by Beacom et al., pp. 2001-2004.
IBM TDB-vol. 24, No. 6, Nov. 1981-"Multiple Memory Error Correction"-by J. Datres et al.-p. 2690.
IBM TDB-vol. 13, No. 8, Jan. 1971-"Multiple Error Correction"-by B. Bachman et al.-p. 2190.

Primary Examiner—Hoa T. Nguyen
Attorney, Agent, or Firm—Lynn L. Augspurger

[57] ABSTRACT

A computer memory maintainence apparatus tests operating system storage and identifies a malfunctioning memory chip in an on-line memory array by detecting and recording all permanent data errors using data comparison along with data complementation and substitutes a spare memory chip for the malfunctioning one for all memory read commands. All write commands are performed on both spare memory and the malfunctioning memory chip. All contents of defective chip are copied to the spare chip. The computer system maintains the scrubbing and a recording counter for each of the data bits in an ECC memory data word. The sparing logic in the memory storage system maintains the bit steering logic and controls for the spare chip. When a counter is incremented above a threshold sparing is invoked to replace the failing bit position. The system writes to the defective and spare chips in parallel even after bit steering is invoked.

10 Claims, 10 Drawing Sheets

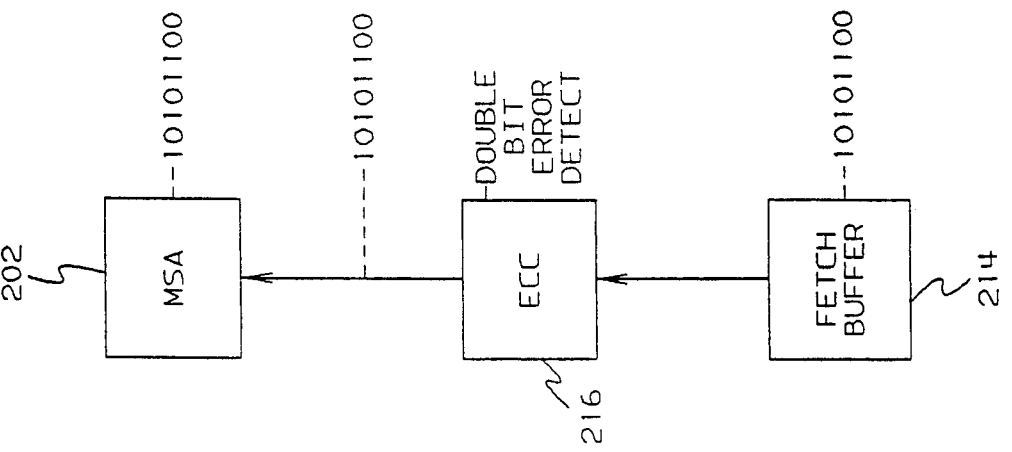
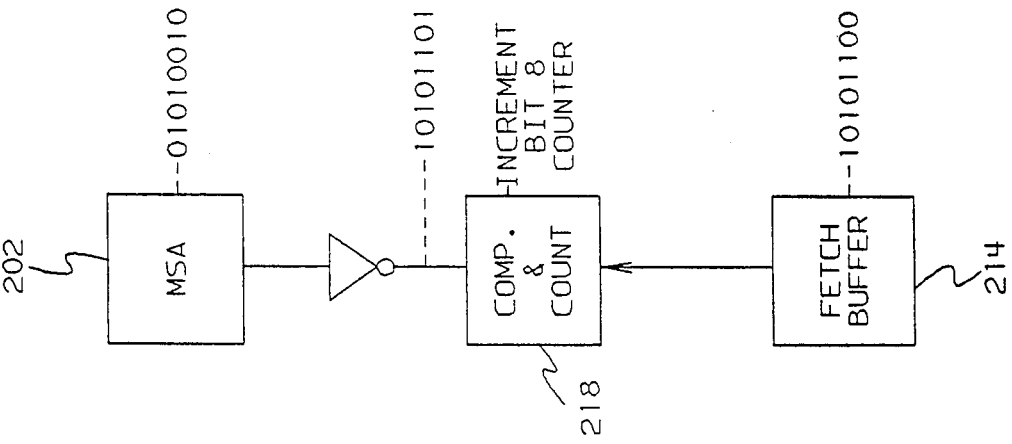
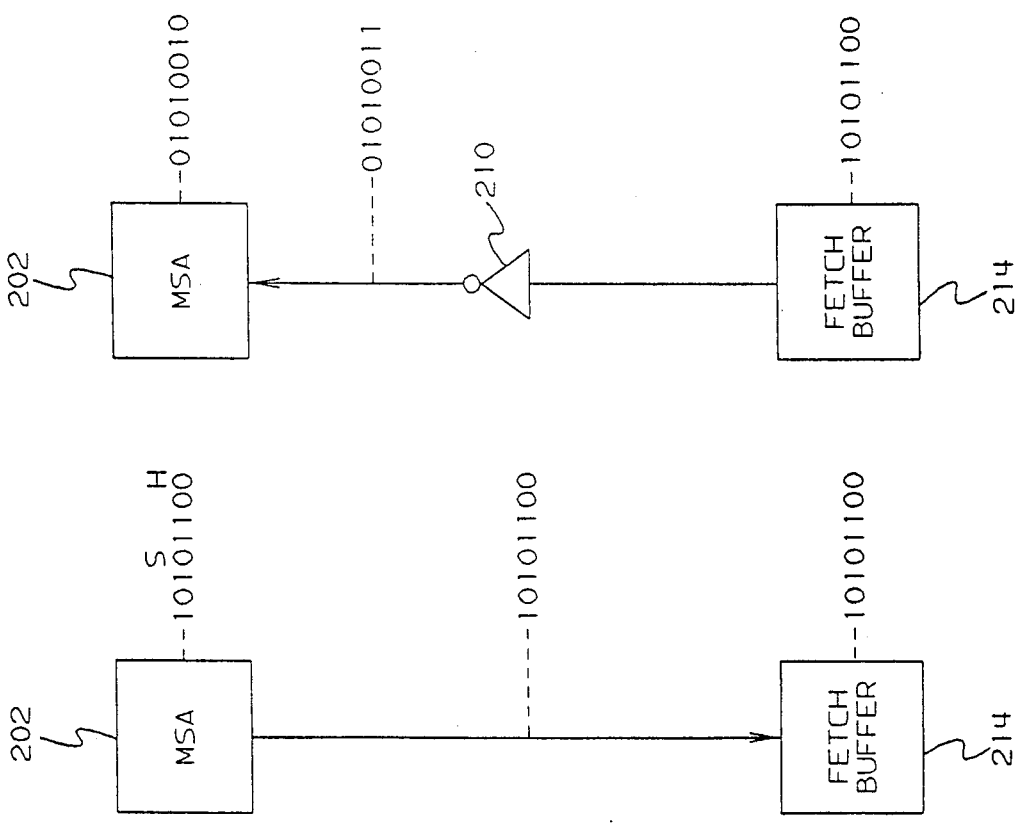

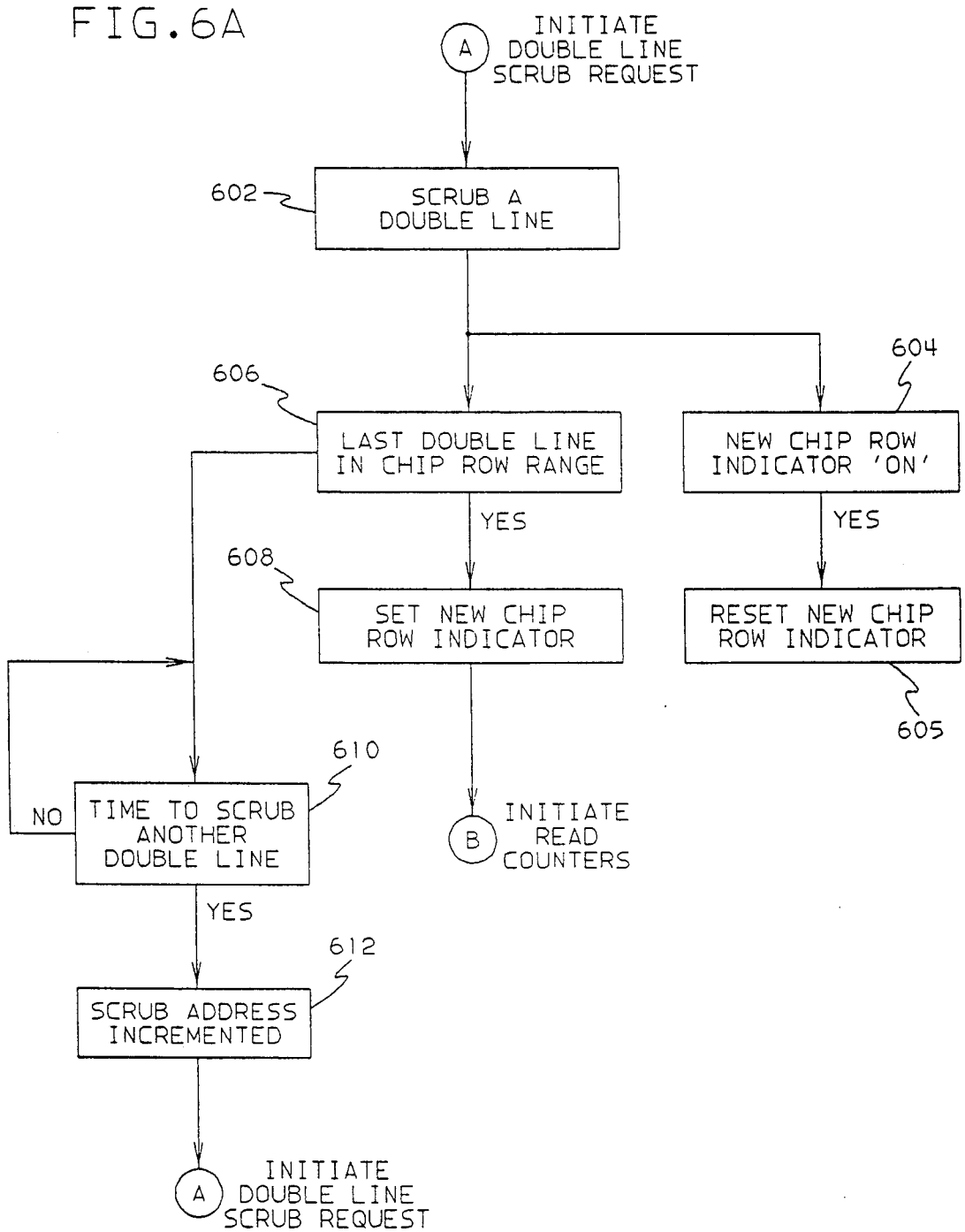

METHOD AND APPARATUS FOR SUBSTITUTING SPARE MEMORY CHIP FOR MALFUNCTIONING MEMORY CHIP WITH SCRUBBING

BACKGROUND OF THE INVENTION a. Field of the Invention

The present invention relates to computer memory storage systems, and more particularly relates to storage systems employing scrubbing and sparing.

b. Related Art

Various arrangements have been suggested in the prior art which permit semiconductor memories to recover from defective data word bit positions caused by soft (transient) and/or hard (non-transient) errors. The data word, for example, may comprise 72 bit positions where 64 positions store data and 8 positions are employed for an error correcting check byte which, when processed by a suitable error correcting system associated with the memory, is capable of automatically correcting a single-bit error in any one of the bit positions of the word. Most systems also are capable of detecting multi-bit errors and are generally designed from a code standpoint so as not to miscorrect any of the good data bits.

The prior art also includes systems for correcting double bit errors. An article entitled "MULTIPLE ERROR CORRECTION" (IBM Technical Disclosure Bulletin, Vol. 13, No. 8, January, 1971, Pg. 2190) describes a circuit for automatically correcting multiple bit errors. When a double error is detected, the word fetched from memory is read into an error register and the complement of the fetched word is rewritten back into the original memory location. A fetch cycle is then executed on the complement of the fetched word. The word and its complement are compared in an Exclusive OR circuit that identifies the location of the failing bits. This information is utilized to complement the incorrect bits in the original fetched word. The information concerning the failing bits is also stored with the address position of the error. When an error is later detected and there is an address match with the address of the earlier error, the failing bits in the new error are corrected automatically. Another scheme, which corrects double bit errors by using an Error Correction Code (ECC) check syndrome in conjunction with a complement/recomplement type algorithm is described in an article entitled "MULTIPLE MEMORY ERROR CORRECTION" (IBM Technical Disclosure Bulletin, Vol. 24, No. 6, November, 1981, Pg. 2690).

In order to correct soft errors that tend to occur in the memory array between refresh cycles, many conventional systems implement a technique known as "scrubbing". During a scrubbing cycle, each memory location in an array is accessed sequentially and the data within is read. Typically, ECC logic checks each data word and corrects any single bit errors. The data is then restored to memory. If the single bit error was related to a soft error, the restore operation puts corrected data in place of the bad data that was the soft fail.

The prior art has recognized that certain types of fault conditions in semiconductor memories are basically data dependent in that when a data bit is read out from the faulty position, it is always one binary value or the other. Such errors are commonly referred to as "hard" errors. A mechanism which operates during scrubbing to determine whether a single bit error is a soft error or a hard error is described in an article entitled "HARDWARE MECHANISM TO DETERMINE THE TYPE OF SINGLE BIT MEMORY ERROR" (IBM Technical disclosure Bulletin, Vol. 32, No. 4B, September, 1989, Pg. 241).

Most single and double bit "hard" errors can be corrected using the same error correction techniques as are utilized for soft errors. Some hard errors are, however, uncorrectable. An uncorrectable error will only occur if a random error, hard or soft, occurs at some other bit position at the same time the first defective bit position contains a binary value that is different than the value originally written to that position. Where a bit position in a data word has a "hard error" the likelihood that an uncorrectable error will eventually occur is substantially increased. Since such a data word will always include at least a single bit error, the occurrence of any additional hard or soft errors may cause the data word to become uncorrectable.

To handle instances where a bit position has failed due to a hard error, some prior art systems have been provided with a capability known as "sparing". Sparing (also known as "bit-steering") refers to the replacement of an identified defective bit position by logically steering a bit from a replacement chip into the defective bit position, effectively replacing the defective position. For example, in U.S. Pat. No. 4,584,682 to Shah et al. an array substitution scheme is used to substitute a spare chip for a faulty chip when an uncorrectable error condition results from an alignment of two errors in bit positions accessed through the same decoder, while a bit permutation apparatus is used to misalign faulty bits when they occur in positions accessed through different decoders.

In an article entitled "DYNAMIC SPARING OF STORAGE MODULES" (IBM Technical Disclosure Bulletin, Vol. 29, No. 7, December, 1986, pp. 2828–2829) a method of dynamically sparing a storage module without system disruption is described. The method includes detection of a faulty storage module as well as its replacement with a spare module. The memory is organized or mapped such that each bit of a memory word is associate with a unique storage module. The method of the above described article relies on the use of scrubbing (a conventional technique used to remove correctable soft errors from a storage subsystem in its detection stage). During scrubbing, the error correction code (ECC) generates a syndrome (i.e. a series of bits encoded to contain information about the correctness of the data word) for each word it reads and rewrites. During a given scrub pass the syndrome of any single bit error (SBE) occurrence is held. If the same syndrome occurs more than N times during that scrub pass, the bit indicated by the syndrome is identified for sparing. During the next scrub pass, the bit in question is stored back into both the old location and the spare. At the end of this pass, the spare bit is switched into use. This allows the system to run and use the storage in question with minimum impact.

While the above-described systems provide an increased degree of memory reliability they leave a number of problems unresolved. For example, all of the above-described error correction methods fall short when more than two errors occur simultaneously in a single ECC data word. In cases where the data word has more than a double bit error a correct result is not ensured. Further, in such cases where more than two errors occur simultaneously in the same ECC data word, the erroneous bit locations cannot be identified from the ECC tree thus limiting the capability of the sparing system to timely swap the failing bit positions. Thus there is a need for a sparing system that does not rely on ECC for its implementation and can identify permanent data errors in all bits of the ECC data word simultaneously.

SUMMARY OF THE INVENTION

In light of the foregoing, it is an object of the present invention to improve the chip sparing process such that any number of defective bit positions in an ECC data word can be dynamically identified and that upon reaching a specified criteria a defective bit position can be spared in a manner transparent to the end user of a computer system.

In a preferred embodiment, there is provided a storage system including improved scrubbing and sparing logic whereby the memory storage system is maintained by identifying and recording the number of hard errors on each memory chip. The system maintains a recording counter for each of the data bits in the ECC data word. When one of the counters is incremented beyond a predetermined threshold, the system invokes sparing to replace the failing bit position. When a spare chip is specifically designated to replace a defective chip, the system continues to write to the defective chip in parallel with the spare chip even after bit steering has been invoked. This helps to ensure the reliability of data on the replacement chip in case it is accidentally brought off-line. Advantageously, the continuous updating of the contents of the replaced chip allows its functioning memory to be used as a partial backup for the replacement chip.

The foregoing and other objects, features and advantages of the invention will be apparent from the following detailed description of the preferred embodiment of the invention as illustrated in the drawings.

BRIEF DESCRIPTION OF THE DRAWINGS

FIGS. 4A-4D are hardware data flow diagrams showing an example of the process of FIG. 3.

FIGS. 6A-6C are flow charts showing the sparing determination process according to an embodiment of the present invention;

Like reference numerals appearing in more than one FIGURE denote like elements.

DESCRIPTION OF THE PREFERRED EMBODIMENT

Figure 1:
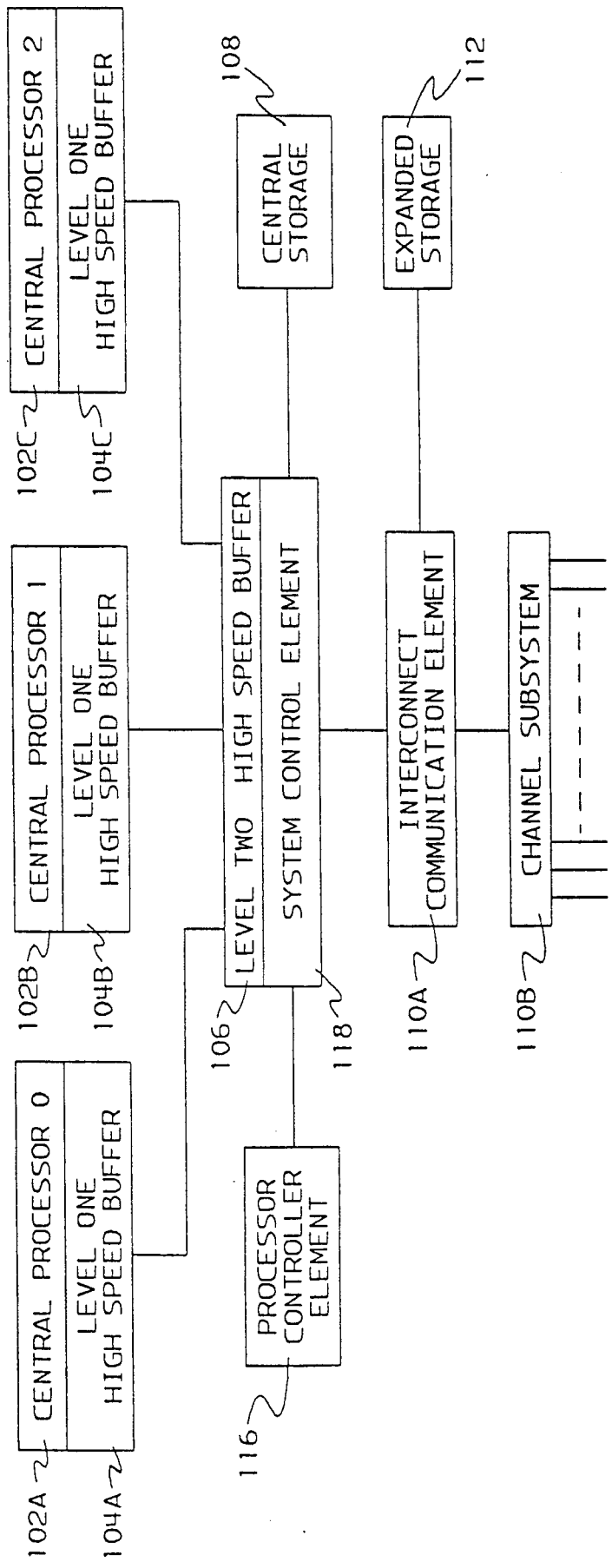
FIG. 1 is a block diagram of a Central Electronic Complex with Central Storage.

The invention will now be described with reference to FIGS. 1-7. FIG. 1 is a block diagram of a Central Electronic Complex (CEC) of a type conforming to IBM Enterprise Systems Architecture/390 (ESA/390). As is conventional, the CEC of FIG. 1 includes three Central Processors 102a-c. Each Central Processor (CP) has its own conventional first level high speed buffer (L1) 104a-c. The L1s are connected in turn to a second level high speed buffer (L2) 106 which is shared by all the CP's. The L2 106 is connected to Central Storage 108, also known as main storage, through a System Control Element (SCE) 118. The general term 'storage' is used to refer to data existing in either level high speed buffer (104a-c or 106) or the Central Storage 108 itself or any Main Storage Array (MSA) used for memory.

The CEC of FIG. 1 also includes an Interconnect Communication Element (ICE) 110a which controls data transfer and communication between the SCE 118, an Expanded Storage (ES) 112 and a Channel Subsystem 110b. The ICE 110a and Channel Subsystem 110b are also collectively referred to as the I/O Subsystem. System operations and support functions such as powering on and off and configuring the system are controlled by a support processor called the Processor Controller Element (PCE) 116. The PCE is also used to assist system elements in recovering from errors.

The present invention can be used in conjunction with with any type of semiconductor storage array whether within the CEC environment of FIG. 1 or within other computer system environments. By way of example, the invention will be described as applied to the Central Storage 108 in the system of FIG. 1.

Figure 2:
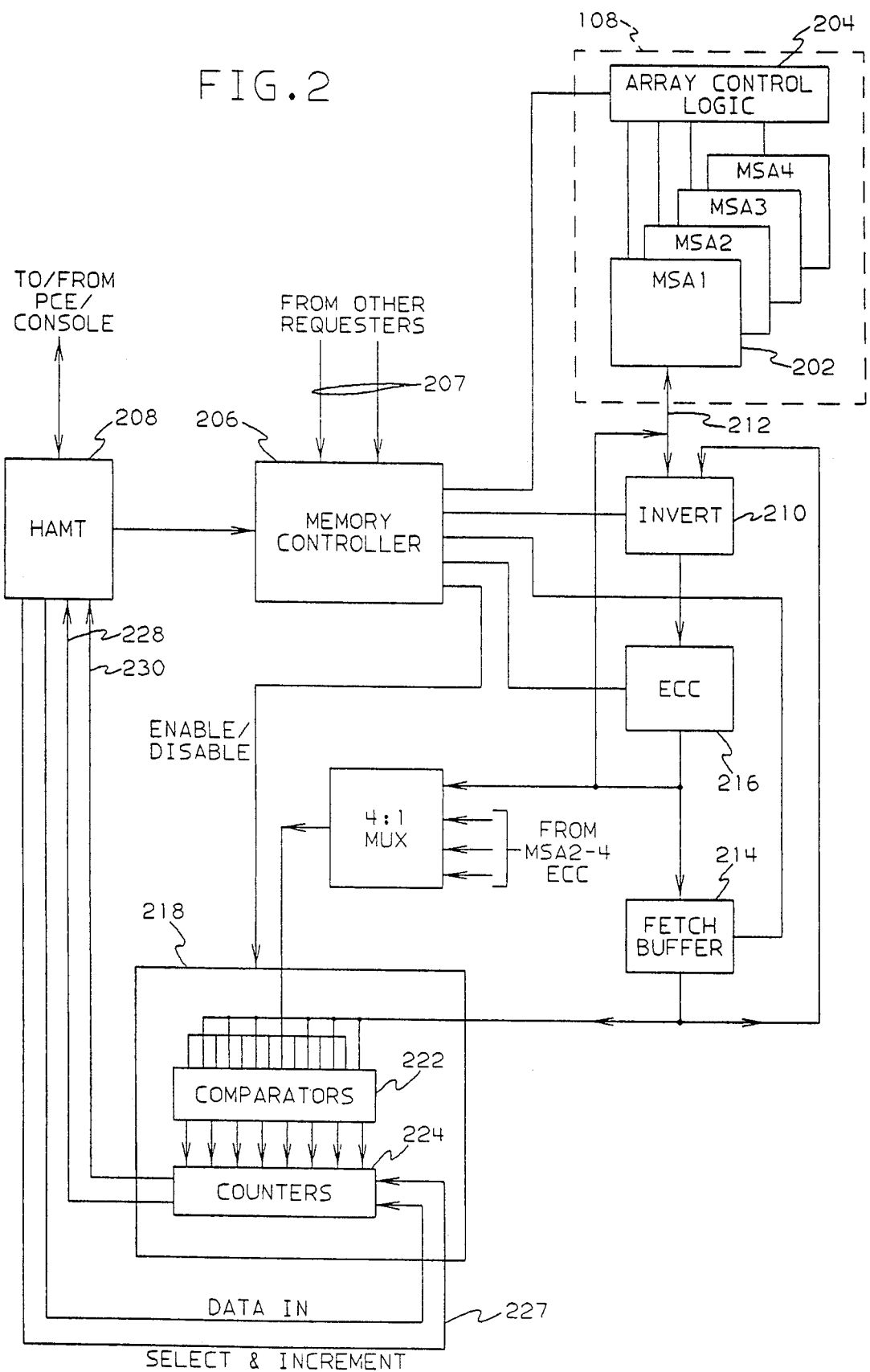
FIG. 2 is a diagram of a scrubbing and sparing system according to an embodiment of the present invention.
Figure 3:
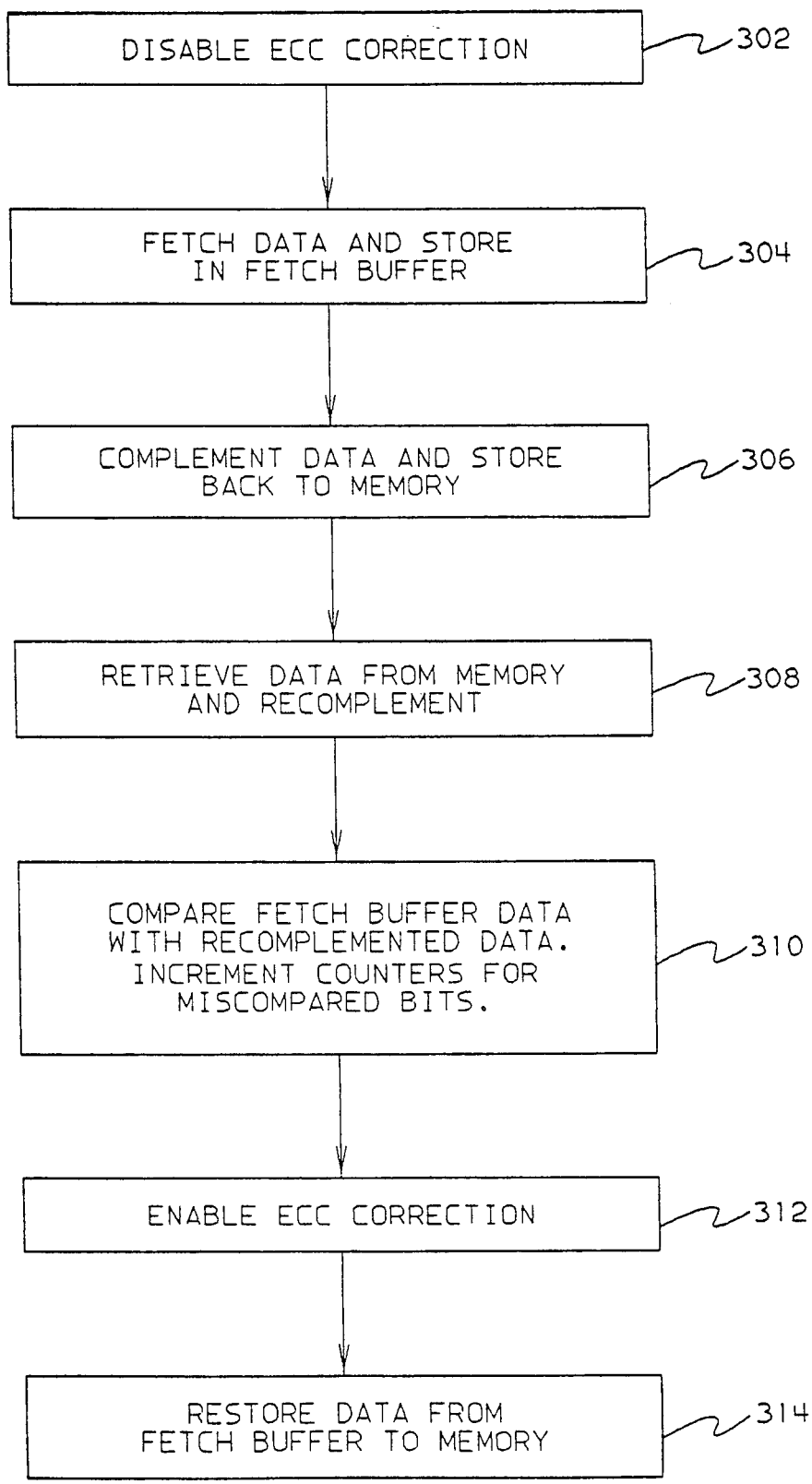
FIG. 3 is a flow chart showing the scrubbing process according to an embodiment of the present invention.

As best illustrated in FIG. 2, the Central Storage 108 includes one or more of Main Storage Arrays 202. The Main Storage Arrays 202 are of a conventional type comprising arrays of dynamic random access memory chips (DRAMS). The number of chip rows per MSA is configuration dependent typically with one or two chip rows per MSA.

In the preferred embodiment, each MSA reads/writes data in the form of two 72 bit ECC data words (144 bit quadword of data) simultaneously. Read/Write access and addressing of the Main Storage Arrays 202 is provided by conventional array control logic 204 which operates responsive to commands from a Memory Controller 206. Scrub operations use physical addresses without any absolute to physical address conversions normally done to other storage requests;

The Memory Controller 206 provides the connections and control signals used by requestors to initiate accesses to the Central Storage 108. These signals service requests from the Hardware Assisted Memory Tester (HAMT) 208 whose function and operation will be described later. Additional connections 207 are provided to serve other requestors (such as the ICE 110A or L2 106) requiring conventional accesses to memory.

MSA1 202 is connected to an input of a selective invert logic 210 by way of its own bidirectional data bus 212. The selective invert logic also has a second data input from a fetch buffer 214 (described in more detail later). The selective invert logic 210 can invert or pass through in uninverted (true) form, the data from either the MSA 202 or the fetch buffer 214. The control of which input to select and whether or not to invert the output of a selected MSA is provided by way of signals from the memory controller 206. The remaining MSAs (MSA 2 - MSA 4) are similarly connected, each to their own selective invert logics (each of which receives a second input from the fetch buffer 214). In operation, only the data from the MSA being scrubbed will be inverted.

The output of the selective invert logic 210 is connected to ECC logic 216. The ECC logic is of the double bit error detect/single bit error correct type which is well known in the art. The ECC logic includes two separate ECC circuits for each MSA with a data path for data fed back from the fetch buffer 214. Each ECC logic 216 operates on the 144 bit quadwords as two individual 72 bit ECC data words, thus providing two separate and distinct eight bit ECCs (one for each 64 data bits in the ECC data word). The ECC logic 216 can be enabled or disabled (error correction turned on or off) by way of a signal from the Memory Controller 206. It should be understood that only the selective invert 210 and ECC logic 216 associated with MSA 1 has been shown for clarity. MSAs 2-4 are connected identically, each to their own duplicate copy of the selective invert logic and ECC logic which operate as described with respect to the identical logic supporting MSA 1. Thus there are four ECC logics in all, each separately controlled by the Memory Controller 206.

The four ECC logics 216 (one for each of the MSAs) are connected to a fetch buffer 214. The fetch buffer is of a conventional type and provides temporary storage for 16 quad words (a double line of data) from a selected MSA (as addressed by the Memory Controller 206). The fetch buffer 214 latches in quadwords from the ECC logic under control of the Memory Controller 206. The output of the fetch buffer 214 (a quadword) is provided as an input to the selective invert logic 210 and as an input to compare and count logic 218. In the context of the system of FIG. 1, the fetch buffer 214 is also used in common by the SCE to provide data from the central storage to the L2 High Speed Buffer (the connection to the L2 buffer is not is not shown for clarity).

It should be understood that there are many workable alternative embodiments for the fetch buffer 214. For example, one common fetch buffer can be provided for all of the MSAs. Alternatively, two identical fetch buffers can be provided so as to handle requests in tandem. As a further alternative, a separate fetch buffer can be provided for each MSA. In any event, the fetch buffer output is connected as an input to the selective invert logics for the MSAs and to the compare and count logic 218.

The quadword output of the ECC logic 216 and the quadwords from each of the remaining three ECC logics associated with MSA 2-4 are also provided to a 4:1 multiplexer (4:1 MUX) 220. The 4:1 MUX 220 connects a selected one of the four quad words from the ECC logic to the compare and count logic 218. The selection of a quadword is made under control of signal lines from the Memory Controller 206.

The compare and count logic 218 comprises two sets of components, a plurality of comparators 222 and a plurality of counters 224. The comparators comprise 144 comparators in all, one for each bit of the quadword. Each comparator is thus connected to compare a unique bit position in the quadword provided by the 4:1 MUX 220 with its counterpart provided by the fetch buffer 214. In other words, the comparators 222 compare each of the 144 bit positions in the quadword output from the 4:1 MUX with its counterpart in the quadword provided by the output of the fetch buffer 214, resulting in 144 comparison results. The counters 224 comprise 144 counters each being ten bits wide plus one parity bit. The 144 counters thus enable failures from every one of the 144 bit positions to be recorded. Each of the 144 counters represents one bit position in the quadword and is connected to receive the output from a different one of the 144 comparators 222.

Each counter is of a type that will increment each time the connected comparator indicates that a corresponding bit position in the quadword from the fetch buffer 214 does not match its counterpart in the quadword selected via the 4:1 MUX 220. Each of the counters 224 can also be read out and written into as a shift register under control of the HAMT 208. The compare and increment functions of the compare and count logic 218 can be enabled and disabled by the Memory Controller 206 (which, in the present embodiment, enables these functions only during the scrub cycle).

The Hardware Assisted Memory Tester (HAMT) 208 is a programmable memory tester which can be of any of a number of types well known in the art. A prior art memory tester (also sometimes referred to as a storage validator) is described, for example, in U.S. Pat. No. 4,342,084 to Sager et. al., which is incorporated by reference herein, in its entirety, as if printed in full below. In any event, in the context of the system of FIG. 1, the test/memory access programs generated by the HAMT are selected and configured under control of command words from the system console or PCE 116. In the presently described embodiment, the HAMT 208 also performs the function of sequencing scrubbing operations.

The chip scrubbing operation is used to correct soft single bit errors in Central Storage 108 and is also used to record hard errors so that chip failure mechanisms affecting many bits can be detected and, if the replacement criteria has been met, to invoke the HAMT chip sparing logic.

The scrub process is controlled by a HAMT Execution Control Word (HECW) that is loaded into an environmental reset type embedded array by the PCE 116 at initial machine loading (IML) time. The scrub HECW contains a byte for each of the high order address bytes of the two chip row starting addresses and a byte for each of the high order address bytes of the two chip row ending addresses. Internal HAMT logic supplies all other address information, including the MSA ID for the scrub operations at the time the HECW register is loaded from the embedded array. The PCE console is also programmed to provide a programmable error threshold for the counters 224 and a programmable interval for the time between scrub cycles. The above-described information is provided to the HAMT 208 by the PCE 116.

When the time has been reached to scrub another double line, the HECW in the embedded array is read out and loaded into the a HAMT HECW register for execution. After the register is loaded, the current address is incremented to the next double line address if the trigger indicating the start of a new chip row address range is not set.

After the double line is scrubbed, the HECW current address is returned to the embedded array and held for the next scrub operation. This process is repeated for each chip row address range on one MSA and then for each MSA. When the entire memory has been scrubbed, the address controls wrap around and continue again. The programmable scrub interval is set so that all on-line memory storage will be scrubbed in approximately four minutes.

When the last double line within a chip row address range has been scrubbed, HAMT sends 792 advances (read and increment commands) to the compare and count logic 218. The advances cause the contents of the 144 hard error counters 224 to be sent to HAMT on two single bit serial buses. Each bus is connected to a group of 72 counters thus enabling a bit from each of two counters to be read in at the same time. The first group of 72 counters are read in simultaneously with the other group of 72 counters.

As the contents of the hard error counters are being read in, HAMT sends out to the counters zeroes with good parity. After HAMT has read in all counters they are in a reset state. As the counters are being read in, HAMT counts the number of bits received. At the completion of the process of reading in all counters, HAMT checks for a "sparing needed" condition as described below.

When a counter has been fully read in, the HAMT 208 compares the counter value to the threshold set in the PCE register. If the counter equals or exceeds the threshold, a HAMT internal bit is set to indicate sparing is needed and the position of the counter among the 72 counters is also remembered by HAMT. Only the first counter to equal or exceed the threshold per group of 72 counters gets remembered.

Figure 5:
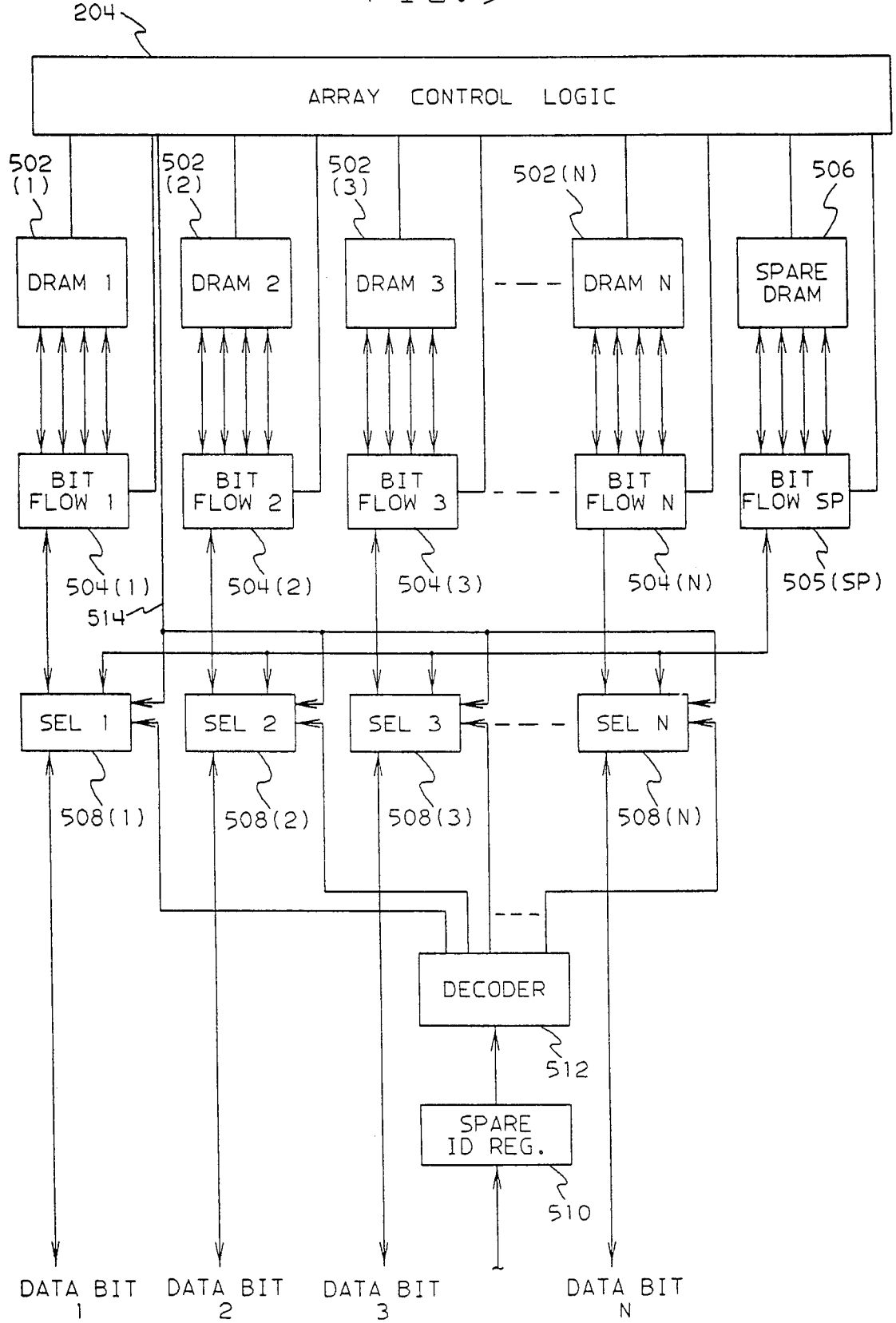
FIG. 5 is a diagram of memory card logic according to an embodiment of the, present invention.

A more detailed view of a memory card within an MSA 202 of FIG. 2 is illustrated in FIG. 5. In the present embodiment each MSA comprises two of such memory cards, each handling storage of 72 bits of the 144 bit quadword. Each memory card comprises a plurality of Dynamic Random Access Memory chips (DRAMS) of a conventional type. In the embodiment of FIG. 5, the DRAMS 502(1)-502(N) and 506 are 1 Meg X 4 bit types. Each of the DRAMS is connected to bit flow control logic 504(1)-504(N), 504(SP). The bit flow control logic selects one bit from each four bit set output/input by each of the DRAMS. The bit flow control logic and the DRAMS operate under control of the array control logic 204 which causes each DRAM in the array to behave as an 4 Meg X 1 bit chip. There are 73 DRAM chips in all on the card of FIG. 5. The first 72 DRAMS 502(1)-502(N) supply 72 of the 144 bits in the fetched quadword (this first set of 72 bits is referred to as the "even" addressed ECC data word). It should be understood that additional rows of chips can be added to provide each card with more memory. A spare DRAM chip 506 is identical to the other, normally on-line DRAM chips 502(1)-502(N) and is also connected to bit flow control logic.

Each of the bit flow control logics 504(1)-504(N) connected to the normally on-line DRAM chips 502 is connected to a corresponding 2:1 select multiplexor 508(1)-508(N). The select multiplexors and the bit flow control logic are bidirectional in nature, allowing data flow both to and from the DRAMS. The second input of the 2:1 select multiplexors is connected, in common, to the output of the bit flow control logic 504(SP) associated with the spare DRAM 506. The select multiplexors 508(1)-508(N) are controlled by a decoder 512 which decodes a sparing vector latched into a spare ID register 510 and control lines 514 from the array control logic 204. When latched into the spare ID register 510, the sparing vector will cause the decoder to activate (select) the select logic associated with the faulty bit position. In response to the sparing vector, the array control logic 204 sends a signal to the select logics 508(1)-508(N) that causes the activated one to behave in one of three modes ("null mode", "store only mode", or "full fetch store mode"). In "null mode" (sparing not active) the select logics will not invoke bit steering notwithstanding of the output of the decoder 512. In "store only mode" the select logic activated by the decoder 512 causes store data (data to be stored) to be sent to both the original (faulty) chip and the spare chip 506, while on a fetch operation data is supplied only from the original chip. In "full fetch/store mode" again, on a store operation data is sent to both the original chip and the spare chip 506, while the fetch operation reads only from the spare chip 506.

A second memory card in the MSA is identical to the card of FIG. 5 and provides the "odd" or upper 72 bit ECC data word of the fetched 144 bit quadword. For reference purposes, the sparing vector that controls sparing in the memory card storing the first group of 72 bits will be referred to as the "even" sparing vector. The sparing vector for the card having the second group of 72 bits will be referred to as the "odd" sparing vector. Similarly, for reference purposes, the memory card storing the first group of 72 bits will be referred to as the "even" addressed memory card while the memory card storing the second group of 72 bits will be referred to as the "odd" addressed memory card.

The sparing vector causes bits from the spare chip to be "bit steered" into a failing position such that data is read only from the spare chip from that point on. However, according to an embodiment of the present invention data continues to be written to both the spare chip and the replaced chip. This occurs both on normal data writes (where data is written to both the spare and the replaced chip) and during scrubbing (where data is read from the spare chip and the scrubbed data from the spare is written back into both the spare chip and the replaced chip). Advantageously, the continuous updating of the contents of the replaced chip allows its functioning memory to be used as a partial backup for the replacement chip.

The decoder 512 and the spare ID register 510 can be embodied in a number of different ways. For example, the decoder can be embodied as 3 separate decode trees with each decode tree providing sparing selection for a group of 24 data bits. In such an embodiment, the spare ID register will consist of three distinct registers one for each component of the sparing vector, each register being connected to a different decode tree. Alternatively, one decoder and one spare ID register can be provided to handle all 72 bits. It should be understood, that as a matter of design choice the bits on the array card could be broken up into any number of decoders and spare ID registers.

Figure 7A:
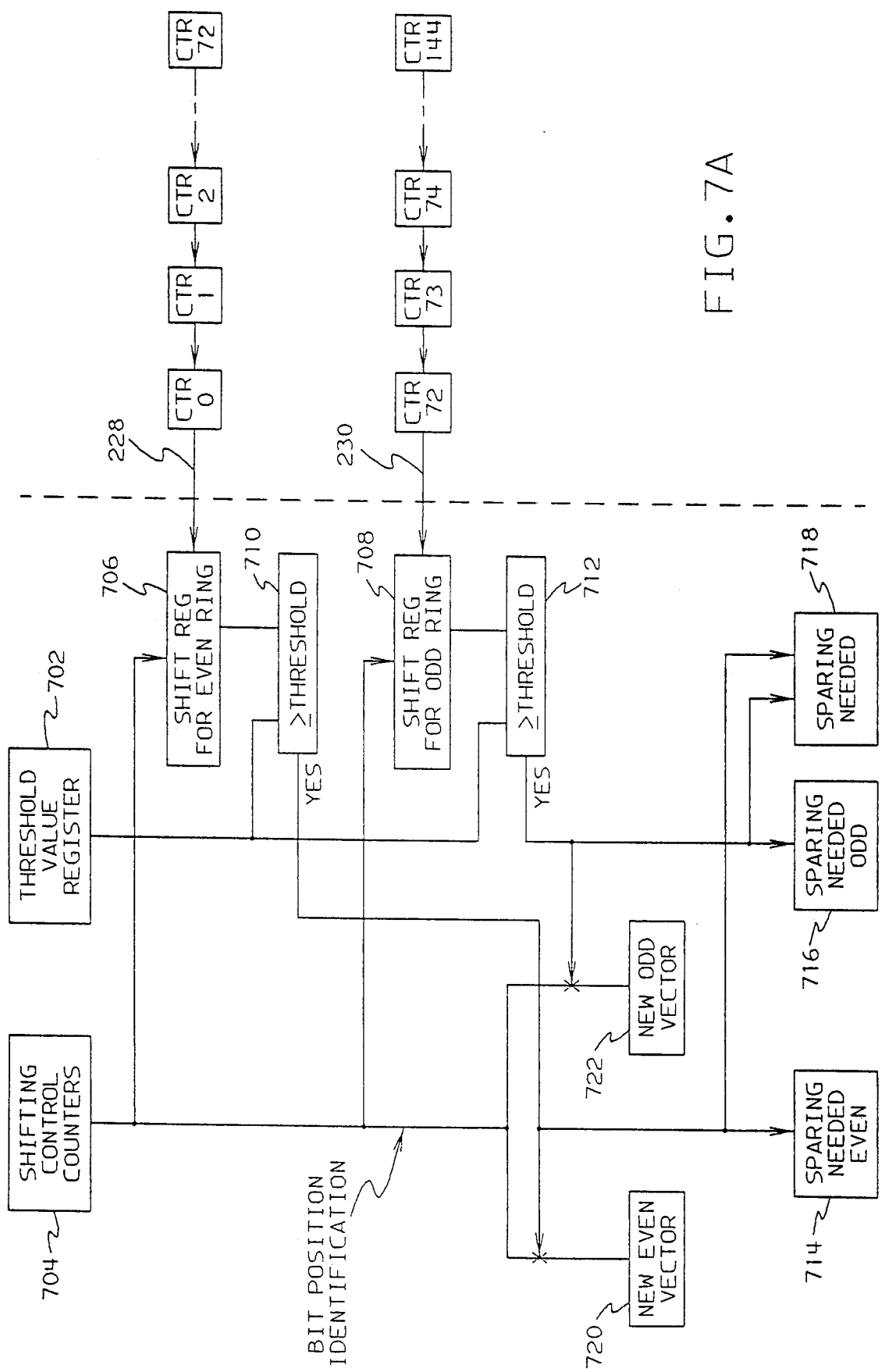
FIGS. 7A-7B are functional block diagrams of the sparing determination and sparing vector generation hardware within the HAMT of FIG. 2.
Figure 7B:
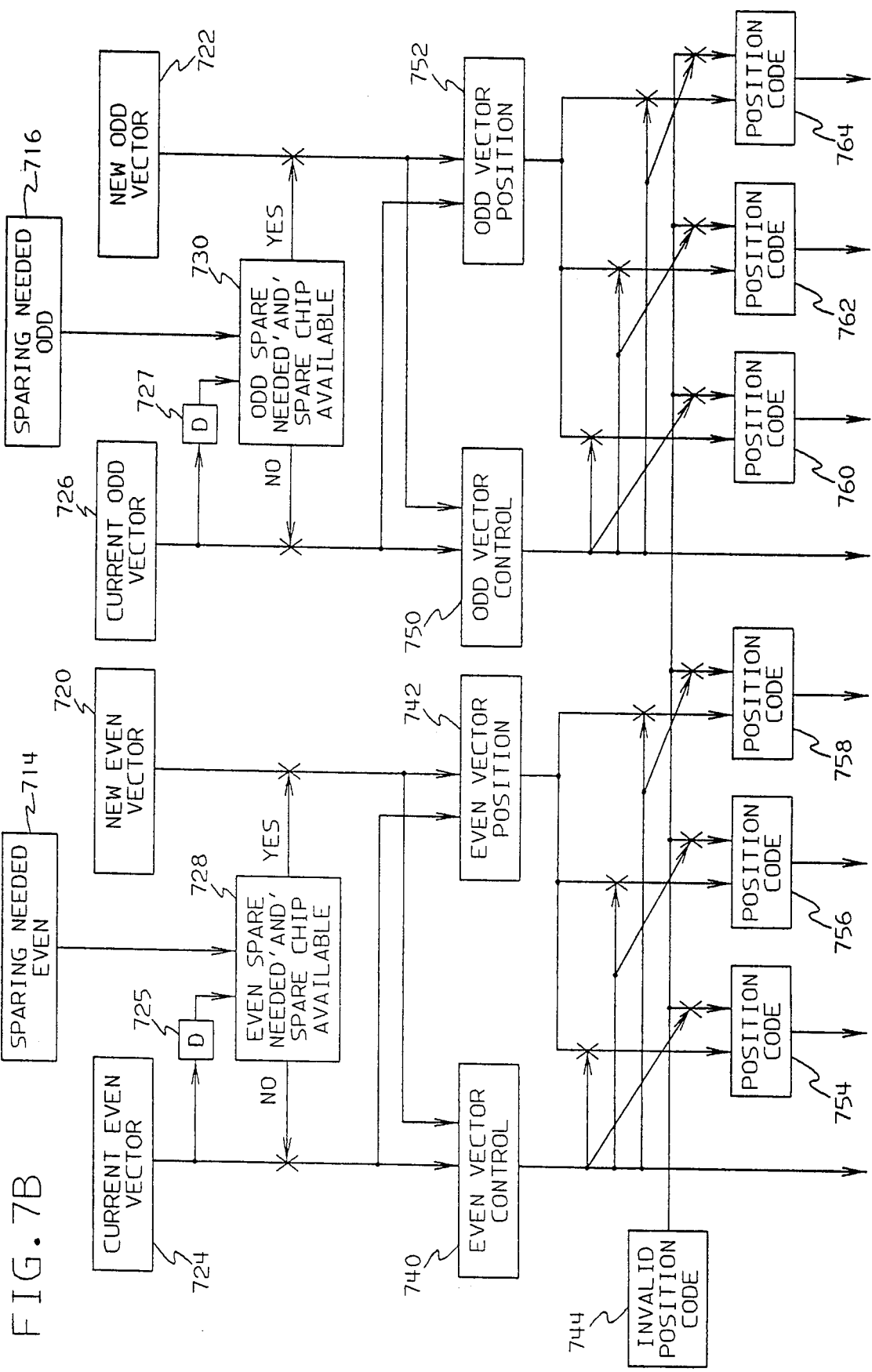

FIGS. 7A and 7B are functional block diagrams of the sparing determination and sparing vector generation hardware within the HAMT 208 of FIG. 2. The HAMT 208 handles the counters 224 in two groups of 72. One group being representative of the "even" addressed memory card on the MSA the other group being representative of the "odd" addressed memory card. A threshold register 702 holds the PCE programmed threshold used to determine the maximum number of allowable errors before sparing out a bit position. Shifting control counters 704 keep track of how many data bits have been shifted in from the counters 224 in the compare and count logic 218 of FIG. 2. The 144 counters in the compare and count logic are read out in parallel as two groups of 72 via two serial busses 228, 230. The first set of 72 counters stores the miscompare counts for the "even" addressed ECC data word, while the second set of 72 counters stores the miscompare counts for the bits of the "odd" addressed ECC data word.

Each group of 72 serial counters has its own associated shift register 706, 708 and its own associated threshold comparator logic 710, 712. Each time the shifting controls 704 indicate that a complete pair of counters have been read in, the comparison against the preset error threshold is made in parallel as to corresponding bit positions in the even and odd addressed ECC data words (each representing a different memory card). When the threshold comparator logic 710, 712 indicates a miscompare for a given bit position a sparing needed indicator is turned on for the appropriate ECC data word (i.e. even, odd or both). The even and odd ECC data words each have there own associated latch 714, 716 to indicate sparing needed. A third latch 718 is connected to contain a logical OR of the even and odd latches 714, 716.

As previously discussed, the shifting control counters keep track of the bit positions and corresponding counters. When the odd or even threshold comparators indicate that the sparing threshold has been met or exceeded, a sparing vector indicating the miscompared bit positions is formed in the corresponding new even vector register 720 and/or the new odd vector register 722 by copying in the bit position indicators in the shifting control counters 704.

FIG. 7B is a functional block diagram of the HAMT sparing vector generation logic. The current even and odd sparing vectors are held, respectively in registers 724 and 726. The even sparing vector handling will first be discussed by way of example. After all of the counters have been read and the third latch 718 has been set, test logic 728 performs a logical "AND" of the even "sparing needed" bit (from register 714) and a "spare chip available" bit (decoded at 725 from the current even vector in register 724). If sparing is needed "AND" the spare chip is available (has not already been used) then the data in the new even vector register 720 is divided into an even vector position component (which is stored in register 742) and an even vector control component (which is stored in register 740).

The sparing vector sent to each array card consists of 3 groups of data sent across the array card data interface from registers 754, 756 and 758. Each of the 3 groups of data consists of 5 bits of position information from registers 744 or 742 and a parity bit. These groups identify the bit position to be spared within the 72 bit array card interface. Each group (one for each of the three decoder trees in the decoder 512 of FIG. 5) has 24 valid encoded position combinations.

Each sparing vector also consists of 5 bits of control information from register 740 and a parity bit sent to the array control logic. These bits identify the chip row that will receive the spare chip as well as to identify which one group of the 3 groups of position bits on the data bus to use in determining the spare chip position. Since only one of the three groups of position information bits will actually be used in sparing, the other two position code registers are loaded with an invalid position code from register 744. The even vector control register 740 controls which position code register receives the valid code from register 742 and which two position code registers receive the invalid code from register 744. Also, the bits sent to the array control logic control the sparing mode on the array card which can be: a) sparing not active; b) store only; or c) full fetch/store.

It should be understood that the odd sparing vector is handled in the same manner as the even sparing vector with components 722, 726, 727, 730, 750, 752 and 760-764 performing in the same manner as their even sparing vector counterparts.

The HAMT 208 keeps track of when a scrub operation is required and the number of addresses which have been scrubbed. Periodically, the HAMT 208 determines when the condition of storage should be evaluated in order to decide if the sparing function should be invoked. This determination is made after all of the addresses in a group of memory chips on a particular MSA 202 are scrubbed. Each scrub request from the HAMT 208, which includes address information as described below, initiates a scrub and count sequence controlled by the Memory Controller 206. The entire sequence is performed on one MSA at a time and repeated for each MSA. This sequence will now be described by reference to FIGS. 3 and 4A–4D:

In step 302, the memory controller disables the ECC correction function of the ECC logic 216. In step 304, after ECC correction has been disabled a double line of data, consisting of 16 quad words of data from one MSA 202, is fetched from the MSA 202 being scrubbed and stored in the fetch buffer 208.

In step 306, with ECC correction still disabled, the double line of data from the fetch buffer is complemented by the selective invert logic 210 and stored back to the same double line address in MSA 202 from which it was fetched. After this step, a copy of the originally fetched double line remains in the fetch buffer.

In step 308, the re-stored complemented data in the MSA from step 306 is retrieved, recomplemented, and passed through the 4:1 MUX 220 to the Comparator 222 by the memory Controller 206. At the same time, the original double line of data stored in the fetch buffer in step 304 is retrieved. In step 308, these two double lines of data are compared by the compare and count logic 218. Any miscompare of any bit in any of the sixteen 144 bit quad words results in the counter (in the set of counters 224) which is associated with the miscompared bit position being incremented. If all 144 bits miscompare, the counter for each of those bits would be incremented by one. The ECC logic is still disabled throughout this step.

In step 312 the ECC error correction function is re-enabled. Then, in step 314, the double line of data stored in the fetch buffer 208 from step 304 is stored back into the original MSA. The ECC logic 216 corrects any single bit errors before performing the store. If any multi-bit errors are detected, the associated 72 bit ECC data word is passed back to the memory without change.

FIGS. 4A–4D illustrate an example of the above-described process from a hardware/data flow perspective. For purposes of illustration, bit positions in the ECC data word will be numbered from left to right, starting with bit position 1.

FIG. 4A illustrates how an ECC data word, e.g. "10101100 . . . " (shown in abbreviated form) is fetched, with ECC disabled, from an MSA 202 being scrubbed and placed into the fetch buffer 204. In this example, we will assume that bit position eight (the last bit on the right) has a hard error which holds the bit stuck at 0, while bit position four has a soft error (in other words, both bit positions four and eight would be set at 1 if the data word was correct). We will further assume that no other bits are defective.

FIG. 4B illustrates how, in the next series of sequence steps, the ECC data word is read from the fetch buffer (with ECC disabled), inverted to form the word "01010011 . . . ", and written back into the original memory location and MSA from which it was fetched. It is noted here that the MSA memory location in question will, at this point, contain an ECC data word of the form "01010010 . . . " because the hard error at bit position eight will force a "stuck at 0" condition. In contrast, the soft error which affected bit position four will not prevent storing of the inverted ECC data word.

FIG. 4C illustrates the next series of sequence steps in which the complemented data is refetched from the MSA 202 (with ECC disabled) and recomplemented to form the data word "10101101 . . . " while at the same time the originally fetched data "10101100 . . . " is read from the fetch buffer 214. The corresponding bits of the two ECC data words are then compared by the compare and count logic 218, which will detect a miscompare at bit position eight. In response to the miscompare, the counter for bit position eight will be incremented by 1.

FIG. 4D illustrates how in the following sequence steps the data word is again read from the fetch buffer, this time with ECC enabled. Since the ECC logic of the embodiment of FIG. 2 can not correct double bit errors, the data word "10101100 . . . " is written back into the MSA in its uncorrected form. In systems where the ECC logic can correct multibit errors, the data word would be corrected by such ECC logic before being written back into the MSA. Should a fetch request from any first level high speed buffer (L1) 104a-c, result in a fetch access to the address in Central Storage 108 where the uncorrectable error (UE) exists the requesting unit initiates a fetch retry double complementing algorithm to correct the data before receiving it (such algorithms are well known in the art).

It is noted that if bit four did not have a soft error (i.e. the hard error affecting bit position eight was the only error) the ECC logic would correct the data word and write "10101101 . . . " back into the MSA. It is further noted that were bit positions four and eight both affected by hard errors, both of the two corresponding error counters would be incremented.

The HAMT scrub determination control process will now be described in more detail by reference to FIGS. 6A-6C.

In response to a double line scrub request (generated internally by the HAMT based on the programmable time interval) in step 602 the HAMT scrubs a double line of data from the MSA being scrubbed. In step 604, the HAMT determines if the new chip row indicator is on (indicating that scrubbing has just commenced on a new chip row) and, if so, turns the indicator off. In parallel step 606, the HAMT determines if the last double line in the chip row range has been scrubbed. If so, in step 608, the HAMT sets the new chip row indicator and then initiates reading of the counters 224 in the compare and count logic 218 (FIG. 6B). If step 606 indicates that the last double line in a chip row range has not been scrubbed, in step 610 the HAMT examines its internal clock and the programmed time interval to determine whether it is time to scrub another double line. If so, in step 612, the scrub address is incremented and another double line scrub request is initiated.

Figure 6B:
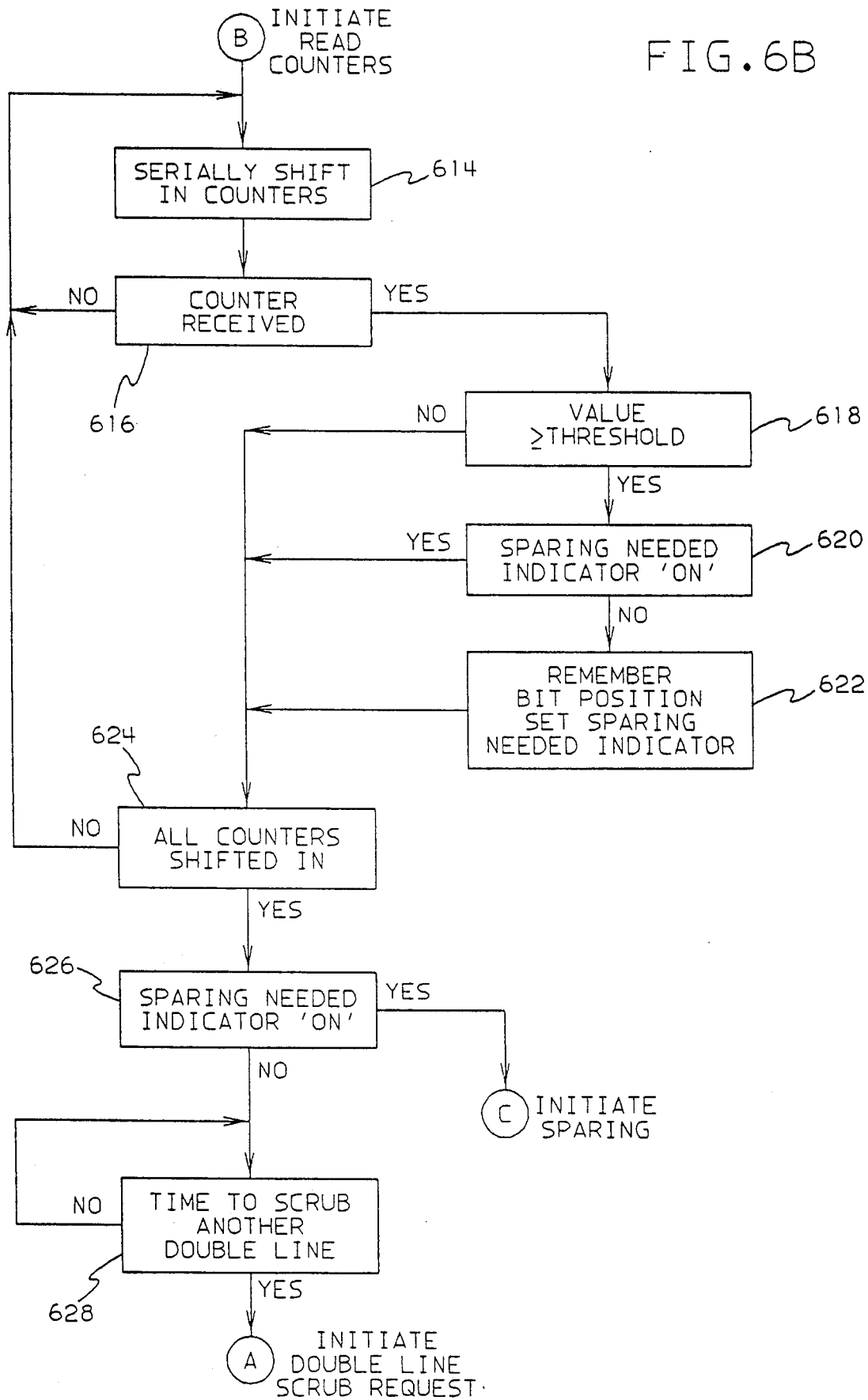

FIG. 6B illustrates the process by which the HAMT initiates and reads the counters 224. In step 614 the HAMT serially shifts in the counters by toggling a select and increment signal on line 227 and reading the counter data (output responsive thereto) on the two single bit serial busses 228, 230. In step 616 the HAMT determines whether an entire counter (one counter per bit position) has been received. If not, step 614 is returned to and the reading of the counters continues. If an entire counter has been received, in step 618 the HAMT determines whether the number of miscompares indicated by the counter is greater than or equal to the sparing threshold value set at the PCE. (An exemplary threshold value is 513.)

If the threshold has not been met or exceeded the HAMT proceeds directly to step 624. If the threshold has been met or exceeded a test is made at step 620 to determine if the "sparing needed" indicator (714 and/or 716) for that card or has already been set (due to a previously tested bit position meeting or exceeding the threshold). If the "sparing needed" indicator is already on, the HAMT proceeds directly to step 624. If the "sparing needed" indicator is not already on (set), in step 622 the HAMT remembers the bit position corresponding to the counter which met or exceeded the threshold and sets the "sparing needed" indicator for that card or cards. The HAMT then proceeds to step 624. In step 624 the HAMT determines whether all of the 144 counters have been shifted in. If not, step 614 is returned to and the reading of counters continues. If so, a test is made at step 626 to determine whether the "sparing needed" indicator 718 is on. If yes, sparing is initiated as illustrated in FIG. 6C. If no, in step 628 the HAMT determines whether it is time to scrub another double line based on the programmable interval set by the PCE 116. If it is time to scrub another double line, a double line scrub request is initiated and processed as illustrated in FIG. 6A.

Figure 6C:
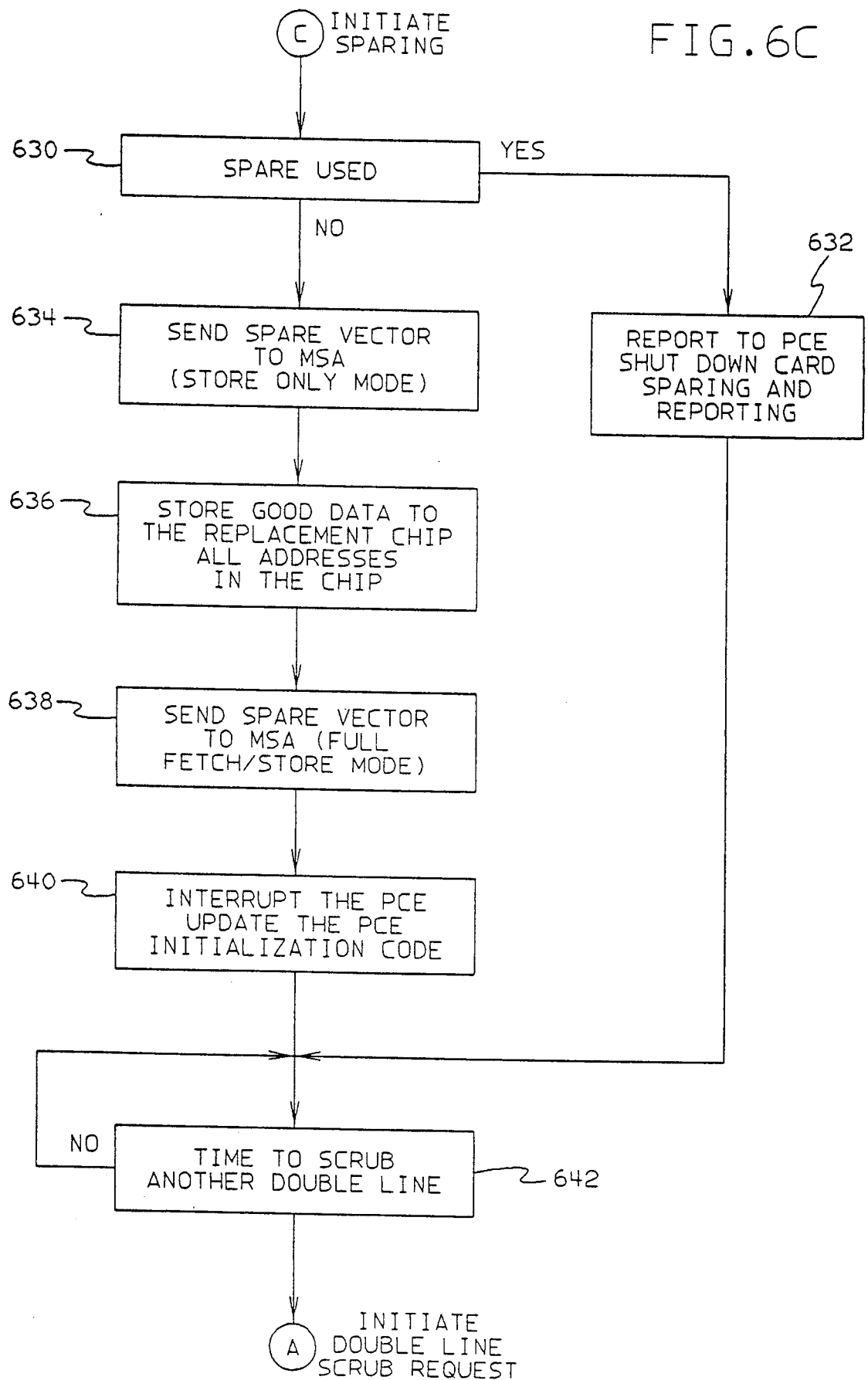

FIG. 6C illustrates the process by which the HAMT handles sparing requests. First, in step 630, the HAMT examines the present sparing vector for the memory card being scrubbed to determine whether the spare chip has already been used. If the spare chip has already been used, the HAMT sends a report to the PCE so indicating. The HAMT hardware also indicate this condition in the current sparing vector and in response thereto, inhibits further sparing and further reporting of the "spare chip used" condition to the PCE (as related to the card being scrubbed). If the spare chip has not been used, the HAMT, in step 634, sends a sparing vector to the MSA containing the memory card and sets the sparing mode to "store only". Next, in step 636 the spare chip is initialized and the good data (taken from the original chip with ECC correction enabled) is copied to the replacement chip. Next, in step 638, a spare vector with "full fetch/store" mode enabled is sent to the MSA having the failing card. Then, in step 640, the HAMT signals the PCE by way of an interrupt. In response to the interrupt, the PCE 116 requests the sparing vector be sent to it so the IML code can be changed to reflect the new configuration of the main memory. Thus, on request of the PCE, the HAMT updates the PCE initialization code with the new sparing vector. Finally, in step 642, the HAMT determines whether it is time to scrub another double line. If so another double line fetch request is generated and handled as illustrated in FIG. 6A.

The HAMT controls the moving of data from the old chip to the new replacement chip for initialization so that it will not contain soft errors when brought on-line. The advantage of keeping the replaced chip on-line and writing to both the replacement chip and the replaced chip is that the replaced chip may still be partially effective. Therefore, if the replacement chip is externally moved off line, the replaced chip contains more accurate data than if it had not been continuously updated. The replaced chip acts as a backup to the replacement chip in this way.

The initial sparing vector issued by HAMT sets the spare chip to "store only" mode (can't fetch from the replacement chip yet). This process allows the replacement chip and the original on-line chip to receive good data on any store operation. At the same time, special scrub operations using the fetch retry double complementing sequence is run to store data into the replacement chip. An uncorrectable error encountered here because another bit position aligned itself with an error from the original chip would see the replacement chip correctly updated by the use of the fetch retry double complementing process. These special scrub operations, which are issued as soon as the previous scrub operation completed, will continue until the chip row address boundary is reached at which time the same spare vectors are re-sent to the array cards but this time the mode has been changed to "full fetch/store". While in "store only" mode, all fetch operations access data from the original on-line chip.

The sparing setup comes from the PCE, which retains all the sparing vector information during power off. During power on the replacement chip is brought back on-line.

There are two ways to write a sparing vector: one is to have the sparing actions come out from HAMT, second is to have the a PCE register control the sparing action. Although the replaced chip is continuously updated by being written to simultaneously with the replacement chip, only the replacement chip is used when data is fetched from central storage.

During the time that complemented data resides in Central Storage (after step 306) there is a lockout in place that prevents such data from being accessed (and is generally used in all double complement methods), which retains data integrity. The memory controller inhibits use of the MSA being scrubbed by any other requestor until the true data is again stored into Central Storage at the end of the double complement operation.

As previously described, this invention's sparing method utilizes a "spare chip on-line" mode, where the original chip continues to be updated after sparing to protect against an error that causes reuse of it, provides a recovery advantage. In many cases the original chip, which met the sparing criteria, may still be good enough that most of its address space can be written and read without errors. By keeping the chip updated, accidental reuse will not be accompanied by millions of soft errors which could form double bit errors with other chips.

Many other modifications and variations that do not depart from the scope and spirit of the invention will now become apparent to those of skill in the art. Thus, it should be understood that the above-described embodiments of the invention have been described by way of example and not as a limitation.

We claim:

1. A method of scrubbing and sparing a memory array of a digital computer storage system comprising the steps of:
   a) fetching an uncorrected data word from a memory array;
   b) temporarily storing said uncorrected data word in a buffer;
   c) complementing said uncorrected data so as to form a complemented uncorrected data word;
   d) storing said complemented uncorrected data word back into said memory array at the location from which said uncorrected data word was fetched;
   e) retrieving said complemented uncorrected data word from said memory array;
   f) recomplementing said complemented uncorrected data word retrieved from said memory array so as to form a recomplemented uncorrected data word;
   g) comparing each bit position in said recomplemented uncorrected data word with a like bit position in said uncorrected data word stored in said buffer;
   h) counting for each bit position, a number of miscompares between said recomplemented uncorrected data word and said uncorrected data word stored in said buffer; said counting including:
      1.) correcting any single bit error in the uncorrected data word from the buffer; and
      2.) storing said corrected data word back into said memory array at the location from which said uncorrected data word was fetched;
   i) when said number of miscompares for any bit position reaches or exceeds a predetermined threshold,
      (1) determining which particular chip in the memory array for the bit position has, the predetermined threshold; and
      (2) selecting a spare memory chip to replace the particular chip, and
      (3) initializing the spare memory chip and correcting while copying all contents of the particular memory chip to the spare memory chip; and then,
   j) after step i, continuing to perform scrubbing all memory write operations to both said spare memory chip and said particular memory chip; and
   k) repeating steps a through h(2) each time said memory array is scrubbed.

2. A data storage system, comprising:
a memory array;
fetch control means for fetching an uncorrected data word from said memory array;
buffer means, coupled to said memory array, for temporarily storing said uncorrected data word;
complementing control means, coupled to said buffer means, for complementing said uncorrected data so as to form a complemented uncorrected data word;
write back control means, coupled to said complementing means and said memory array, for storing said complemented uncorrected data word back into said memory array at the location from which said uncorrected data word was fetched;
retrieval control means, coupled to said memory array, for retrieving said complemented uncorrected data word from said memory array;
recomplementing control means, coupled to said retrieval control means, for recomplementing said complemented uncorrected data word retrieved from said memory array so as to form a recomplemented uncorrected data word;
comparing and count means, coupled to said buffer means and said recomplementing means for comparing each bit position in said recomplemented uncorrected data word with a like bit position in said uncorrected data word stored in said buffer and for counting for each bit position, a number of miscompares between said recomplemented uncorrected data word and said uncorrected data word stored in said buffer means;

testing means, coupled to said compare and count means, for determining that said number of miscompares for any bit position has reached or exceeded a predetermined threshold;

sparing vector generation means, coupled to said testing means, for determining which particular memory chip in said memory array stores data for said bit position reaching said threshold, selecting a spare memory chip to replace said particular memory chip for data reads, for initializing said spare memory chip, and copying all contents of said particular memory chip to said spare memory chip; and memory write control means, coupled to said sparing vector means, for continuing to perform scrubbing all memory write operations to both said spare memory chip and said particular memory chip.

3. The system of claim 2, wherein said testing means comprises means for testing two memory cards in parallel.

4. The system of claim 2 wherein said threshold is programmable.

5. The system of claim 4 wherein said threshold is 513.

6. A computer system, comprising:
a) a central processor;
b) a memory coupled to said central processor for retrieval and storage of data in said memory by memory read and memory write commands provided from said central processor, said memory comprising a plurality of normally on-line memory chips and a spare memory chip; said memory further comprising substituting means for causing said spare memory chip to be substituted for a malfunctioning one of said normally on-line memory chips;
c) memory maintenance means coupled to said memory, said memory maintenance means comprising:
means for testing and identifying a malfunctioning memory chip from among said plurality of normally on-line memory chips; and
means for providing an identity of said malfunctioning memory chip to said memory;
wherein in response to receiving said identity, said memory will substitute said spare memory chip for said malfunctioning memory chip for all substitution means read commands and will cause all memory write commands to be performed for both said spare memory chip and said malfunctioning memory chip.

7. The system of claim 6 wherein said memory comprises control means for establishing one of a plurality of access modes, said control means comprising:
means for establishing a null mode wherein bit steering is not invoked;
means for establishing a store only mode wherein store data is sent to both said malfunctioning memory chip and said spare memory chip, while fetched data is read only from said malfunctioning memory chip; and
means for establishing a full fetch/store mode wherein store data is sent to both said malfunctioning memory chip and said spare memory chip, while the fetched data is reads only from said spare memory chip.

8. The computer system of claim 6, wherein said memory maintenance means comprises:
fetch control means for fetching an uncorrected data word from said memory;
buffer means, coupled to said memory, for temporarily storing said uncorrected data word;
complementing control means, coupled to said buffer means, for complementing said uncorrected data so as to form a complemented uncorrected data word;
write back control means, coupled to said complementing means and said memory, for storing said complemented uncorrected data word back into said memory at a location from which said uncorrected data word was fetched;
retrieval control means, coupled to said memory, for retrieving said complemented uncorrected data word from said memory array;
recomplementing control means, coupled to said memory, for recomplementing said complemented uncorrected data word retrieved from said memory array so as to form a recomplemented uncorrected data word;
comparing and count means, coupled to said buffer means and said recomplementing means for comparing each bit position in said recomplemented uncorrected data word with a like bit position in said uncorrected data word stored in said buffer and for counting for each bit position, a number of miscompares between said recomplemented uncorrected data word and said uncorrected data word stored in said buffer means;
testing means, coupled to said compare and count means, for determining that said number of miscompares for any bit position has reached or exceeded a predetermined threshold;
sparing vector generation means, coupled to said testing means, for determining which particular memory chip in said memory array stores data for said bit position reaching said threshold, for identifying said particular chip as said malfunctioning memory chip, for initializing said spare memory chip, and copying all contents of said malfunctioning memory chip to said spare memory chip; and
wherein said memory further comprises:
memory write control means, coupled to said sparing vector means, for continuing to perform scrubbing all memory write operations to both said spare memory chip and said malfunctioning memory chip.

9. The system of claim 8 wherein said threshold is programmable.

10. The system of claim 9 wherein said threshold is 513.

* * * * *